(12) United States Patent
Akatsu et al.

(10) Patent No.: US 6,329,271 B1
(45) Date of Patent: Dec. 11, 2001

(54) SELF-ALIGNED CHANNEL IMPLANTATION

(75) Inventors: Hiroyuki Akatsu, Yorktown Heights; Yujun Li, Poughkeepsie; Jochen Beintner, Wappingers Falls, all of NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/588,244

(22) Filed: Jun. 6, 2000

Related U.S. Application Data

(62) Division of application No. 09/418,181, filed on Dec. 28, 1998.

(51) Int. Cl.$^7$ .................................................. H01L 21/425
(52) U.S. Cl. .................. 438/526; 438/298; 438/296; 438/174; 438/232; 438/270; 438/301; 257/336; 257/344; 257/396
(58) Field of Search ...................................... 438/526, 296, 438/294, 301, 298, 221, 174, 232, 270, 510; 257/304, 344, 336, 396

(56) References Cited

U.S. PATENT DOCUMENTS 5,559,357 * 9/1996 Krivokapic ........................... 257/336

* cited by examiner

*Primary Examiner*—Charles Bowers
*Assistant Examiner*—Hsien-Ming Lee
(74) *Attorney, Agent, or Firm*—Stanton C. Braden

(57) ABSTRACT

A short channel insulated gate field effect transistor has within the semiconductor body that houses the transistor a buried layer of the same conductivity type as the body but of higher impurity concentration. The buried layer is below the channel region and essentially extends only the distance between the drain and source regions of the transistor. The process to form the device provides high concentration in the region under the gate to suppress lateral depletion region expansion, while keeping a gradual junction in the vertical direction.

5 Claims, 3 Drawing Sheets

SELF-ALIGNED CHANNEL IMPLANTATION

This is a divisional of application Ser. No. 09/418,181 filed Dec. 28, 1998.

FIELD OF THE INVENTION

This invention relates to semiconductor devices, and more particularly, to a process for the manufacture of field effect transistors that exhibit a desirable reduction in the short channel effect.

BACKGROUND OF THE INVENTION

It is known that as the dimensions of field effect transistors are scaled down for faster switching speed and lower current requirements, there arises the short channel effect. In order to increase the speed, the length of the channel between the source and drain of a field effect transistor is shortened. As is channel is shortened, there is a tendency in operation for breakdown to occur between the source and drain at voltages less than would otherwise be expected. This short channel effect is generally blamed on the spread, during operation, of depletion regions of the source and drain into the channel. As the depletion regions meet or as one extends from the drain/source to the source/drain, breakdown occurs.

Various techniques have been tried to attenuate this effect. One technique, described as the halo junction technique, involves forming highly doped regions of the same conductivity type as the semiconductor body, but of higher conductivity, around portions of the drain and source excluding portions of the drain and source near the surface of the semiconductor body where the channel is formed when the transistor is biased on. This results in large steep p-n junctions that undesirably increases junction capacitance and leakage current.

Another technique uses a first blanket implantation of the semiconductor body area where a transistor is to be formed to form a buried region of the same conductivity type as the semiconductor body but of higher impurity concentration. This forms what is known as a retrograde type well. A second blanket implantation of the same conductivity type impurities is then done to modify the conductivity at and close to the surface of the semiconductor body so as to control threshold voltage. A gate dielectric layer is then formed followed by the formation of a gate. The gate is then used as a mask and there is an implantation of the source and drain, which are formed aligned to the gate. The resulting structure undesirably increases junction capacitance and leakage current.

Another known attempt to solve the short channel problem involves first implanting the surface of the chip where the inversion channel is to be formed to increase the doping at the surface, a step often practiced to control the threshold voltage of the device. This is followed by implanting the top surface more deeply to form a continuous layer extending the length of the active area that is of the same conductivity type as that of the source and drain and underlies the source and drain to limit the spread of the depletion regions.

However in such a device there is also increased undesirably the junction capacitance and the leakage current.

The present invention seeks to improve on both these techniques.

SUMMARY OF THE INVENTION

The present invention solves the problem of introducing a highly doped buried layer of the conductivity type opposite that of the source and drain that extends below the channel only along the width of the channel by forming such buried layer in a way to be self aligned with the gate and the channel. In particular, in an illustrative example, the novel process of the invention comprises the following steps. First, as is usual, there are formed over a top surface of a semiconductor body an underlying PAD silicon dioxide and an overlying PAD silicon nitride layer.

At this point, it is usual to implant the semiconductor body with acceptor ions to form a P-well where N-MOSFETs are to be formed and with donor ions to form an N-well where P-MOSFETs are to be filed. Further mention of such steps will be omitted as unnecessary. These layers are then patterned to expose the surface of regions of the semiconductor body where silicon oxide shallow trenches, characteristic of shallow trench isolation (STI) are formed and then filled with a suitable dielectric, preferably silicon oxide. Advantageously, the deposited silicon oxide layer is made to have the same height above the surface as the PAD nitride layer. This can be readily achieved by overfilling the shallow trenches, and then planarizing the surface by chemical mechanical polishing (CMP) using the PAD nitride as the etch stop.

Next, where the gate region is to be formed there is removed the PAD nitride layer that is still overlying the active area, forming a recess, but leaving the PAD oxide layer. This PAD oxide is left to protect the chip surface during the subsequent implantation of the surface. Alternatively, this PAD oxide can be etched completely away and replaced by a new thermally grown oxide layer, generally described as a sacrificial oxide layer, for use to protect the surface of the gate region during ion implantation. Now there is formed by ion implantation and aligned with the recess that defines the future gate region a buried heavily doped layer that is of the same conductivity type as that of the semiconductor body and opposite that of the future drain and source areas to be formed in the body.

The bulk region between the source and drain that includes the layer that is to be inverted to form the channel is typically described as the base region and is of the conductivity type opposite that of the source and drain regions. The process of forming a MOSFET typically includes a shallow ion implantation of the base region to set the threshold voltage $V_T$ of the transistor. The type of ion implanted to set the threshold voltage generally will depend on the doping modification needed to provide the desired threshold voltage. After the implantations are completed, the PAD oxide left in the intermediate region can be stripped, still leaving the PAD dual layers on either side of the implanted region.

Now there is formed a suitable gate oxide over the exposed recessed region between these PAD layers, after which polysilicon suitable for serving as the gate electrode, is deposited to overfill the recess region between the PAD layers. This gate electrode will be well aligned with the heavily doped buried layer formed by the earlier implantation. This initial gate electrode typically is covered over with another conductive layer such as tungsten silicide to form a gate stack. This gate stack is then planarized to the level of the PAD nitride layer and the STI layer. Now there is stripped the remaining PAD nitride and the underlying PAD oxide layer, after which dielectric spacers typically of silicon oxide are formed on the side walls of the gate stack. Now with the STI polysilicon layer and the gate stack as a mask, there are formed the source and drain regions by ion implantation. These will be self aligned with the deeper implanted layer that underlies each gate stack, whereby there is reached the ideal structure sought.

In an alternative embodiment, after there have been defined the active areas and these have been surrounded by the silicon oxide that provides the STI as in the first embodiment, the surface of the semiconductor body is covered with a layer of a masking material and this is patterned to expose the surface region where there is to be formed an extended gate conductor that will overlie the surface and interconnect the gates of all the transistors in a common row or column. Then the regions, including both active area regions and STI regions exposed where this pattern passes over then are etched in two steps, first in an oxide-nitride selective etch to form a pattern in the STI and the future gate regions, and then in an nitride selective etch to stop at the oxide layer over the gate region. Then there follow the implantations to form the buried layer under the gate region and to set the threshold voltage. Next there follows deposition of a gate conductor layer over the surface for filling the various gate regions and the pattern formed in the surrounding STI by the two-step etch mentioned above, as will be described more fully below.

Each of these two embodiments of the invention provides a buried region of high conductivity that is well aligned with the channel and gate and so will help suppress lateral depletion expansion. Moreover, the buried layer forms steep p-n junctions with the source and drain regions that should be of low junction capacitance and small junction leakage, and these factors should mitigate the short channel effect.

The invention will be better understood from the following more detailed description taken with the accompanying drawing.

Figure 1:
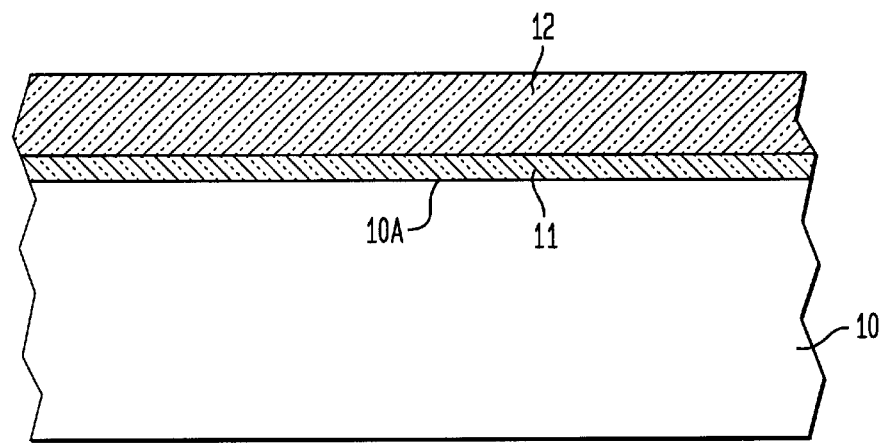
FIG. 1 through FIG. 6 show in cross section a portion of a semiconductor body (substrate) at various stages in one illustrative process as it is being processed to form therein an insulated gate field effect transistor in accordance with the present invention.

It should be noted that the drawing is not the scale.

DETAILED DESCRIPTION OF THE INVENTION

With reference now to the drawing, FIG. 1 shows a portion of a semiconductor body (substrate) 10 in which there is to be formed an insulated gate field-effect transistor with the improved structure to mitigate the short channel effect in accordance with the present invention. In this illustrative embodiment semiconductor body 10 is of p-type conductivity silicon and typically is a P-type well in a monocrystalline silicon body in which an n-channel insulated gate field effect transistor is to be formed. Over a top surface 10A of the body 10 a layer of silicon oxide 11 and a layer of silicon nitride 12 are provided to form the dual layer that has been described as the PAD layer. Generally this transistor will be one of many like transistors formed in the semiconductor body.

Then by standard photolithographic techniques, the PAD layer is patterned to keep covered the region generally described as the active area where the transistor will be located, exposing the surrounding surface area where there will be formed a shallow trench that will be filled with a dielectric, typically silicon dioxide, that will serve to isolate the active area region of individual transistors from the surrounding region.

Figure 2:
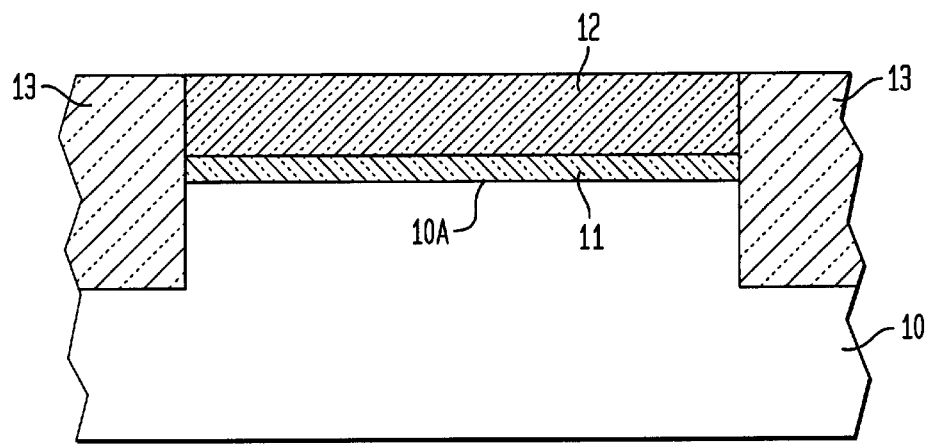

FIG. 2 shows portions of a shallow oxide-filled trench 13 surrounding a central active area in which a transistor will be formed. Advantageously, the height above the semiconductor body surface of the silicon oxide 13 in the trench should match the height of the PAD layers 11 and 12 as is shown in FIG. 2.

Then the remaining PAD layer is patterned again to expose a central portion 14 thereof, down to the PAD oxide layer 11, where the inversion channel is to be formed. This also corresponds to the gate region of the MOSFET. After this portion 14 is exposed the semiconductor body 10 is implanted with acceptor ions to form in the semiconductor body a buried layer 16, aligned with portion 14. As a result of the implanted ions, after annealing, the buried layer 16 has a higher concentration of acceptor ions than that of the rest of semiconductor body 10. The optimum depth of the peak concentration is a function of the junction depth of the source and drain regions. It is typically is 30–50 nanometers below the surface 10A and the width of the implanted region should be close to or slightly less than one half of the peak depth so that the dopant concentration is not excessive at the surface 10A. Advantageously, the average concentration in this implanted region should be between about $10^{17}$ to $10^{19}$ acceptors/$cm^3$. This is at least an order of magnitude greater than originally exists in the region where the channel is to be formed, which average concentration typically is of the order of $10^{16}$ acceptors/$cm^3$, but may be higher. This doping is adjusted and optimally is dependent on channel length and device performance expected. The exposed oxide layer portion of the original PAD layer is kept to protect the surface of the semiconductor body 10 from damage during the implantation, or as previously discussed may be removed and replaced with a new sacrificial oxide layer. Annealing follows the implantation, which results in some slight widening of the layer because of lateral diffusion.

Figure 4:
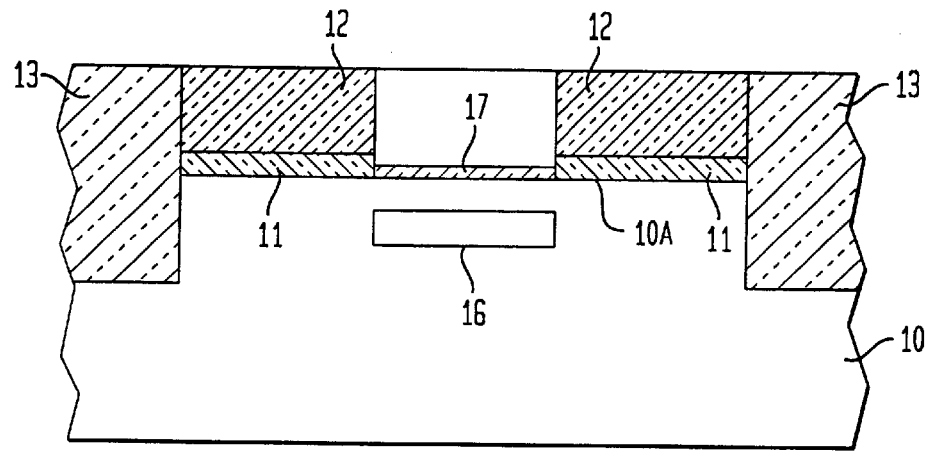

This first deep implantation is typically followed by a second shallow implantation that primarily serves to adjust for a desired threshold voltage, the doping level in the region adjacent the surface 10A that, during operation, will be inverted to form the channel of the transistor. The higher the p-type acceptor doping in this region the higher the threshold voltage needed to create inversion. In some instances if the acceptor doping level in the semiconductor body 10 originally was too high for a desired threshold voltage, this second implantation can be of donor ions. Next advantageously there is stripped away the remaining silicon dioxide layer 11 in the exposed portion 14. After cleaning, a silicon oxide layer 17, more suitable for serving as the gate dielectric of the transistor, is formed in any known fashion over the exposed silicon surface of region 14, as is shown in FIG. 4. The gate region 17 will be well aligned with buried layer 16.

After formation of the gate dielectric layer 17, a layer of a material suitable for use as the gate conductor is deposited over the surface of the semiconductor body 10, for filling the central opening 14 in the PAD layer 12 to form gate 18.

Figure 5:
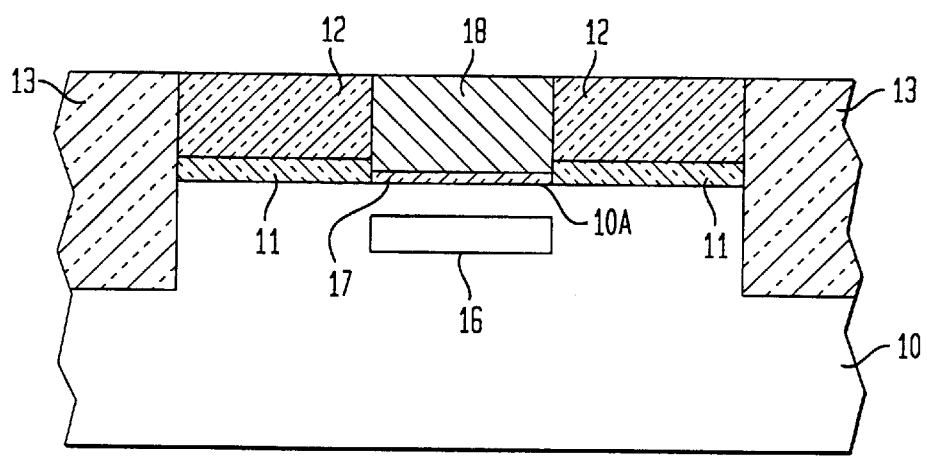

This layer typically is silicon, either polysilicon or amorphous, either doped or intrinsic as deposited. In either case, at the end of the process it advantageously should be N-type if an N-type channel device (N-MOSFET) is made, or P-type if a P-type channel device (P-MOSFET) is made. Generally, satisfactory fill is insured by overfilling to extend the deposit over any remaining PAD layer 12 and the STI layer 13, and then planarizing it, typically by chemical mechanical polishing, to the level of the PAD and STI layers 12 and 13, respectively, to reach the structure shown in FIG. 5. The gate conductor layer 18 will be well aligned over the buried implanted region 16. To improve the conductivity of the gate, instead of the sole use of doped polysilicon for the gate conductor, a silicide, such as tungsten silicide can be used as a topping over the silicon.

The remaining PAD layer portions 11 and 12 are etched away and then sidewall dielectric spacers 20A and 20B typically of silicon nitride, are formed on the sidewalls of the gate conductor 18. It may be desirable to leave a portion of the oxide PAD layer in place to protect the silicon surface until after the ion implantation. However, it will be desirable still to describe the underlying silicon body as effectively exposed. Self-aligned source and drain regions 21 and 22 are then formed in conventional fashion typically by ion implantation using the gate 18 with the dielectric sidewall spacers 20A and 20B and the STI portions 13 as a mask. Source 21 and drain 22 are typically made less deep than the buried layer 16 but will be well aligned with it, although in some instances they may be made deeper. Actually, there may be some slight overlap because of the lateral diffusion that will occur during the usual post-implantation annealing.

If desired, one or more of the source, drain and gate contacts can be of the forms now described as salicide (self-aligned polycide) contacts formed in the usual manner for such contacts.

Figure 6:
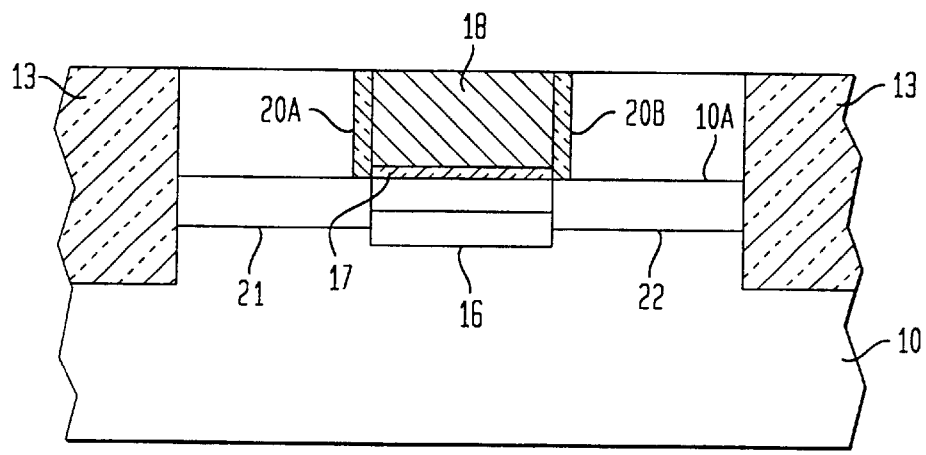

The result is shown in FIG. 6 with n+ type source 21 and n+ type drain 22 well aligned on opposite sides of the earlier p-type implanted deep region 16, but shallower than it, although previously mentioned, in some special instances it may be advantageous to make the source 21 and drain 22 deeper than the buried layer 16.

After this, there can be deposited a capping dielectric layer, typically silicon oxide or silicon nitride, (not shown) over the wafer, preliminary to forming over the surface the various conductive and insulative layers usually included for interconnecting it into an integrated circuit, such as a memory.

During operation when the transistor is biased "on", a channel region (not shown) is formed between the source 21 and the drain 22. The channel region advantageously should be shallower than implanted region 16.

The length of region 16 is determined by the length of opening 14 through which region 16 is formed. The sidewalls of opening 14 also effectively determine the location of sidewalls of source 21 and drain 22. Thus region 16 contacts-the sidewalls of source 21 and drain 22 and is essentially aligned to the channel region. Region 16 and the source 21 and the drain 22 are thus all essentially self aligned.

A modification in the just described process can be made to take better advantage of the shallow trench silicon oxide that surrounds the active area at the point shown in FIG. 2. In this modification, a mask 33 is positioned over the top surface 10A of the semiconductive body 10 and it is patterned as is shown in the top view of FIG. 7 where stippled region 31 represents the opening in the mask 33. The stippled region 31 includes square regions 35 that correspond to the gate regions of the transistors and these are also the central regions of horizontal rectangular areas 37 that correspond to active areas that are surrounded by the STI regions 33.

Then there follow in turn a first, typically a reactive ion etch (RIE) that is selective both of the silicon nitride pod layer over the gate regions 35 and the silicon oxide of the STI regions 33. This etch is timed to remove only a portion of the silicon nitride pad layer and to form a shallow pattern in the exposed regions of the STI. Next there follows an RIE that is only silicon nitride selective to remove the rest of the silicon nitride PAS layer over the gate regions 35, leaving the same shallow pattern in the exposed STI.

Figure 3:
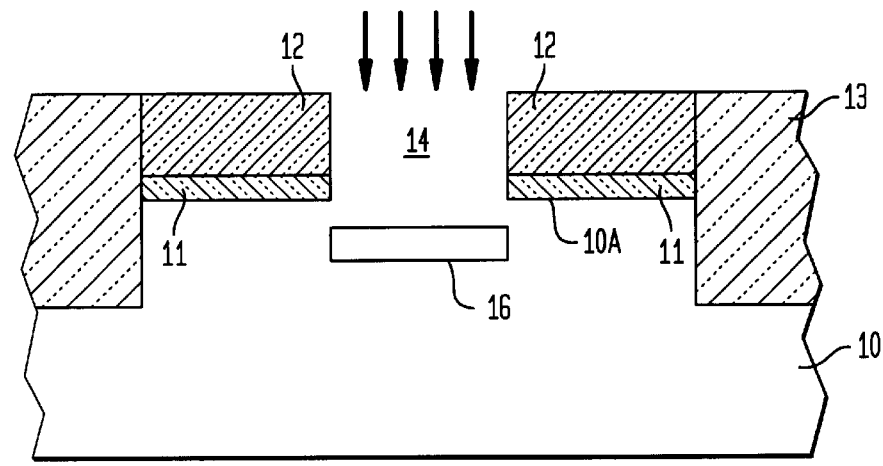
Figure 7:
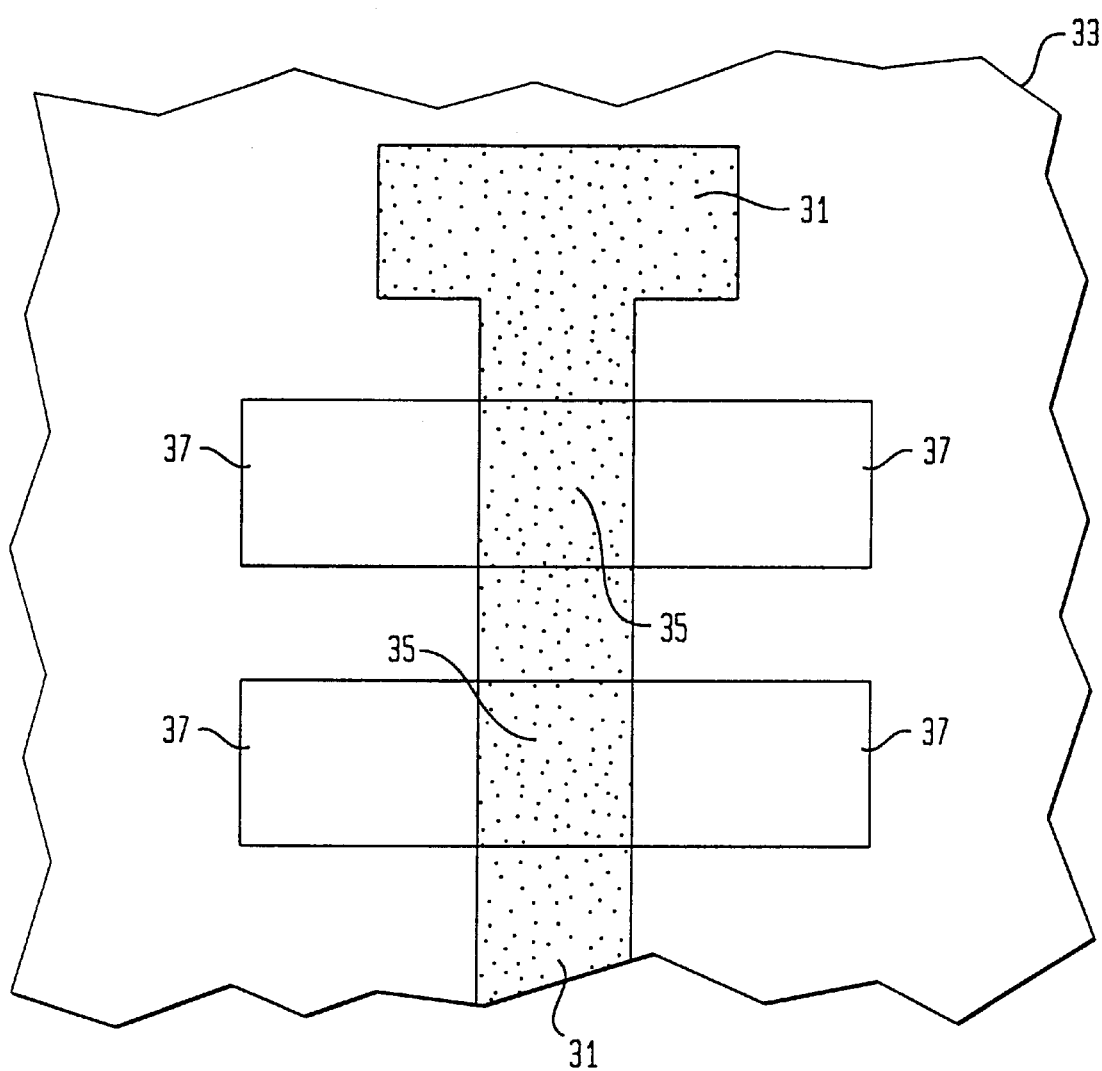
FIG. 7 is a top view showing the pattern of the gate conductor over the top surface of the semiconductor body to interconnect a pair of gates in a common column, as it is being processed in accordance with an alternative process of the invention.

Next there follow the implantation steps to form the buried layer 16 as shown in FIG. 3 and to set the threshold voltage $V_T$ of the transistor, if this be needed. The silicon oxide that still remains over the gate region can also be replaced with a cleaner silicon oxide layer more suitable for use as the gate dielectric. Now there is deposited over the surface a layer of a conductor, typically doped polysilicon. This layer will fill not only the gate region recess formed by removal of the PAD silicon nitride but the shallow recess formed in the STI by the first timed RIE etch, as shown by pattern 31. This now forms a continuous conductive layer over the surface that connects to all of the gate regions included within the pattern 31 of which only two are shown in FIG. 7. In a DRAM these would be an entire row/column of gate regions of the memory array.

After the gate conductor is deposited, it is planarized by CMP to the level of the STI oxide and the dual PAD layer over the active region that was not a part of the gate region. Now the remaining dual PAD layer regions on the opposite sides of the gate regions are removed as before, preliminary to the donor ions to form the source and drain region as in the first described embodiment. The remainder of the process is as in the first embodiment.

As a possible variation of this process, after the formation of the STI, as shown in FIG. 2, there can be deposited a hard mask over the its top surface. Then a layer of a photoresist is deposited and developed to form a pattern 31 in it corresponding to that desired for the gate conductor, as also shown in FIG. 7, after which the hard mask is patterned in a corresponding fashion. Now RIE is performed to get down to the silicon surface in the region 31, after which the photoresist is removed. Now there is performed, as before, ion implantations to form the buried region 16 and to set the voltage threshold of the transistor. Then, as before, a new gate oxide can optionally be formed to replace the PAD oxide in the gate region.

Now there can be deposited the gate conductor over the surface to overfill the patterned regions in the hard mask, after which it can be planarized to the level of the hard mask, so that it has the pattern 31 shown in FIG. 7. Then there can be removed the remaining hard mask.

As a possible implementation one can use as the hard mask doped polysilicon or doped glass that can be etched selectively with respect to the STI so that the STI is little affected by the etching used to remove the hard mask.

It is to be understood that the specific embodiment described is merely illustrative of the general principles of the invention. Various modifications should be feasible without departing from the spirit and scope of the invention. For example, other dielectric materials are feasible for use in filling the shallow trenches or for use in forming the initial dual layer that is first patterned to define the active area of the transistor and layer patterned to define the channel region of the transistor. Of course, the invention should be similarly applicable to p-channel insulated gate field effect transistors by reversal of the conductivity types of the various regions.

What is claimed is:

1. A method for forming field effect transistors in a semiconductor body of one conductivity type which has a surface layer comprising the steps of:

forming over the surface layer of the semiconductor body a dual layer including an underlying thin silicon oxide layer and an overlying thick silicon nitride layer;

patterning the dual layer to leave an intermediate region of the dual layer in place between two regions where it has been removed;

forming an isolation trench surrounding each of said regions where the dual layer has been removed;

filling said trenches with a dielectric material to the same height above the surface of the semiconductor body as that of the dual layer in said intermediate regions;

forming a recess in the region of the dual layer essentially of a length to match the length of the channel desired for the field effect transistor;

irradiating the semiconductor body with dopant ions characteristic of the one conductivity type to form, aligned with said last-mentioned recesses in the dual layer, an implanted buried region of the one conductivity type with an impurity concentration greater than that of the semiconductor body;

forming over said recess a layer suitable for use as the gate dielectric;

filling in the recess over the gate dielectric layer with conductive polysilicon to the level of the isolation trenches and the dual layer;

removing at least most of the dual layer remaining in the regions between the conductive polysilicon and the isolation trench for effectively exposing the surface layer of the semiconductor body; and doping the regions of the exposed surface layer of the semiconductor body with dopants characteristic of the conductivity type opposite said one conductivity type for forming source and drain regions of the transistors, said source and drain regions being on opposite sides of the implanted buried regions.

2. The method of claim 1 in which the filling of said trenches to the same height above the surface as that of the dual layer includes overfilling the trench to cover the dual layer and then planarizing the fill by chemical mechanical polishing to the desired height using the dual layer as the etch stop.

3. The method of claim 2 in which the fill is silicon oxide.

4. The method of claim 2 in which the filling of the opening in the dual layer to the level of the isolation trench conductive polysilicon includes overfilling the opening to cover the remaining dual layers and then planarizing the resulting surface with chemical mechanical polishing using the dual layers as the etch stop.

5. The method of forming a semiconductor body that includes a plurality of transistors whose gates are interconnected by a common gate conductor comprising the steps of:

forming over the surface of the semiconductor body a dual layer including an underlying layer of silicon dioxide and an overlying layer of silicon nitride, patterning the dual layers to expose regions where there is to be formed a trench for the isolation of the transistors in the semiconductor body leaving unpatterned active area regions where the transistors are to be formed, filling said exposed regions with silicon oxide forming an isolation trench, providing a masking layer over the semiconductor body and patterning it to expose regions where the gate conductors are to be formed each for interconnecting the gates of a plurality of said transistors, forming a recess only in the intended gate regions corresponding to the pattern in said last mentioned masking layer, irradiating the semiconductor body with dopants to form a buried layer under the intended gate regions of the semiconductor body and to set the threshold voltage of the transistors, forming a gate dielectric layer, depositing a layer of material suitable for use as the gate conductor over the semiconductor body, and planarizing said layer of suitable material to the level of the isolation trench and the remaining dual PAD layer, removing the remaining dual PAD layer for exposing regions where the source and drain of the transistors are to be formed, and implanting ions into the semiconductor body to form the source and drain regions of the transistors.

* * * * *